United States Patent
Ulm et al.

(10) Patent No.: US 7,563,633 B2
(45) Date of Patent: Jul. 21, 2009

(54) MICROELECTROMECHANICAL SYSTEMS ENCAPSULATION PROCESS

(75) Inventors: Markus Ulm, Wannweil (DE); Brian Stark, Los Altos, CA (US); Matthias Metz, Palo Alto, CA (US); Tino Fuchs, Tubingen (DE); Franz Laermer, Wailderstadt (DE); Silvia Kronmueller, Schwaikheim (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 11/510,040

(22) Filed: Aug. 25, 2006

(65) Prior Publication Data
US 2008/0050845 A1 Feb. 28, 2008

(51) Int. Cl.
*H01L 21/00* (2006.01)
(52) U.S. Cl. .............................. 438/51; 438/106; 438/55
(58) Field of Classification Search ........................ None
See application file for complete search history.

(56) References Cited

U.S. PATENT DOCUMENTS

| | | | |
|---|---|---|---|
| 5,470,627 A * | 11/1995 | Lee et al. ................... | 428/64.4 |
| 5,683,591 A | 11/1997 | Offenberg | |
| 6,808,953 B2 | 10/2004 | Partridge | |
| 6,869,879 B1 * | 3/2005 | Ryan ........................... | 438/689 |
| 6,930,367 B2 * | 8/2005 | Lutz et al. ................... | 257/417 |
| 6,936,491 B2 | 8/2005 | Partridge | |
| 6,936,902 B2 | 8/2005 | Reichenbach | |
| 6,939,809 B2 | 9/2005 | Partridge | |
| 6,952,041 B2 | 10/2005 | Lutz | |
| 2002/0187647 A1 * | 12/2002 | Dhindsa et al. ............. | 438/710 |
| 2003/0183916 A1 * | 10/2003 | Heck et al. .................. | 257/684 |
| 2003/0187555 A1 | 10/2003 | Lutz | |
| 2003/0211650 A1 * | 11/2003 | Martin ......................... | 438/50 |
| 2004/0124481 A1 | 7/2004 | Partridge | |
| 2004/0124483 A1 | 7/2004 | Partridge | |
| 2004/0163476 A1 | 8/2004 | Partridge | |
| 2004/0183214 A1 | 9/2004 | Partridge | |
| 2004/0207489 A1 | 10/2004 | Lutz | |
| 2004/0209435 A1 | 10/2004 | Partridge | |
| 2004/0245586 A1 | 12/2004 | Partridge | |
| 2004/0248344 A1 | 12/2004 | Partridge | |
| 2005/0014374 A1 | 1/2005 | Partridge | |
| 2005/0019974 A1 | 1/2005 | Lutz | |
| 2005/0073078 A1 | 4/2005 | Lutz | |
| 2005/0095833 A1 * | 5/2005 | Lutz et al. ................... | 438/597 |
| 2005/0106318 A1 | 5/2005 | Partridge | |
| 2005/0142688 A1 | 6/2005 | Partridge | |
| 2005/0151592 A1 | 7/2005 | Partridge | |

(Continued)

OTHER PUBLICATIONS

D. Gao, W. R. Ashurst, C. Carraro, R. T. Howe, R. Maboudian, "Silicon Carbide for Enhanced MEMS Reliability," *In the Proceeding of The 2004 Sensors and Actuators Workshop*, Hilton Head, S.C., 2004.

(Continued)

*Primary Examiner*—Thao P. Le
(74) *Attorney, Agent, or Firm*—Courtney Staniford & Gregory LLP

(57) ABSTRACT

An encapsulated MEMS process including a high-temperature anti-stiction coating that is stable under processing steps at temperatures over 450 C is described. The coating is applied after device release but before sealing vents in the encapsulation layer. Alternatively, an anti-stiction coating may be applied to released devices directly before encapsulation.

21 Claims, 5 Drawing Sheets

U.S. PATENT DOCUMENTS

| | | |
|---|---|---|
| 2005/0156260 A1 | 7/2005 | Partridge |
| 2005/0162239 A1 | 7/2005 | Lutz |
| 2005/0179099 A1 | 8/2005 | Lutz |
| 2005/0195050 A1 | 9/2005 | Lutz |
| 2005/0242904 A1 | 11/2005 | Lutz |
| 2005/0253209 A1 | 11/2005 | Lutz |
| 2005/0255645 A1 | 11/2005 | Lutz |
| 2005/0260783 A1 | 11/2005 | Lutz |
| 2006/0290449 A1* | 12/2006 | Piazza et al. .................. 333/187 |
| 2007/0196945 A1* | 8/2007 | Martin ........................ 438/48 |
| 2008/0055703 A1* | 3/2008 | Pan ............................ 359/290 |
| 2008/0138580 A1* | 6/2008 | Low et al. ................... 428/156 |

OTHER PUBLICATIONS

R. Candler, W.-T. Park, H. Li, G. Yama, A. Partridge, M. Lutz, T. Kenny, Single Wafer Encapsulation of MEMS Devices *in IEEE Transactions on Advanced Packaging*, pp. 227-232, vol. 26, No. 3, 2003.

A. Partridge, A. Rice, T. W. Kenny, M. Lutz, "New thin film epitaxial polysilicon encapsulation for piezoresistive accelerometers," unidentified IEEE publication, p. 54-59, 2001.

* cited by examiner

US 7,563,633 B2

MICROELECTROMECHANICAL SYSTEMS ENCAPSULATION PROCESS

RELATED APPLICATION

This application is related to U.S. patent application Ser. No. 10/454,867 (patent application publication number US 2004/0248344 A1) incorporated herein by reference.

TECHNICAL FIELD

The invention relates generally to microelectromechanical systems (MEMS) fabrication processes. In particular it relates to encapsulated MEMS fabrication with improved anti-stiction properties.

BACKGROUND

"Microelectromechanical systems" (MEMS) refers broadly to small, mechanical devices constructed using techniques traditionally associated with integrated circuit wafer processing. In microelectronics, circuits are fabricated on semiconductor wafers upon which minute features are defined by building up and etching back regions of materials with specific electronic properties. Tremendous progress has been made over the past 30 years in making circuits smaller, from the millimeter scale to the micrometer scale to today's nanometer scale features.

Tools for semiconductor processing have become more widely available as the microelectronics industry has matured and that has helped create opportunities for microfabrication of new mechanical devices. These microelectromechanical systems (MEMS) include miniaturized gears, levers, cantilevers, springs, etc. However, physical scaling laws show that mechanical devices on a micro scale can operate quite differently from their everyday cousins and have vastly superior performance in some respects. In other words, they are not simply smaller, but also different. (See, for example, Kurt Petersen, "Silicon as a Mechanical Material", Proceedings of the IEEE, Vol. 70, No. 5, May 1982, pages 420-457.)

Perhaps the most important feature defining MEMS in contrast to microelectronics is that MEMS may contain moving parts. In most cases, such as MEMS accelerometers or MEMS oscillators, the moving parts must be protected from the environment. A recent advance in MEMS technology is the development of techniques for wafer-level encapsulation of mechanical structures. Encapsulation provides for not only protection of the mechanical components but also for direct integration with electronic devices in the wafer.

A promising encapsulation technique is described by Partridge, et al. in "Microelectromechanical systems, and methods for encapsulating and fabricating same," US Patent Application Publication US 2004/0248344 A1, incorporated herein by reference. Partridge discloses, in part, a thin-film polysilicon encapsulation process that can increase the die count on a wafer by nearly an order of magnitude without a corresponding increase in cost. This technique is showing utility for of micromechanical resonators but has yet to be fully applied to structures that are more likely to come into contact like accelerometers.

Industry experience suggests that accelerometers require anti-stiction coatings for full functionality. An anti-stiction coating prevents silicon surfaces from creating a temporary or permanent bond (stiction) if they touch. Parts in a MEMS accelerometer sometimes come into contact with each other. It is important that they not stick together otherwise the function of the device is ruined. Organic films have been used as anti-stiction coatings in conventional MEMS processes. These films are rarely capable of withstanding process temperatures above about 450 C, however.

The final stages of recent and successful encapsulation methods involve processes at temperatures of at least 450 C and often as high as 800 C or above. No suitable organic film anti-stiction coating has been found that is compatible with these processes. Therefore what is needed is a method of incorporating a high-temperature anti-stiction film in a modern encapsulation process.

DETAILED DESCRIPTION

A method for incorporating a high-temperature anti-stiction film in a MEMS encapsulation process is described. The method is illustrated for a process that uses a low-temperature oxide seal (FIGS. 1A-4A) and for a process that uses an epitaxial seal (FIGS. 1B-4B). An alternative embodiment of the method is illustrated in FIGS. 5A and 5B.

In this application "layers" comprise materials formed in sheets substantially parallel to a flat substrate. In contrast "coatings" or "films" comprise materials that are applied to surfaces that may lie at arbitrary angles to a substrate including parallel or perpendicular to it.

Figure 1A:
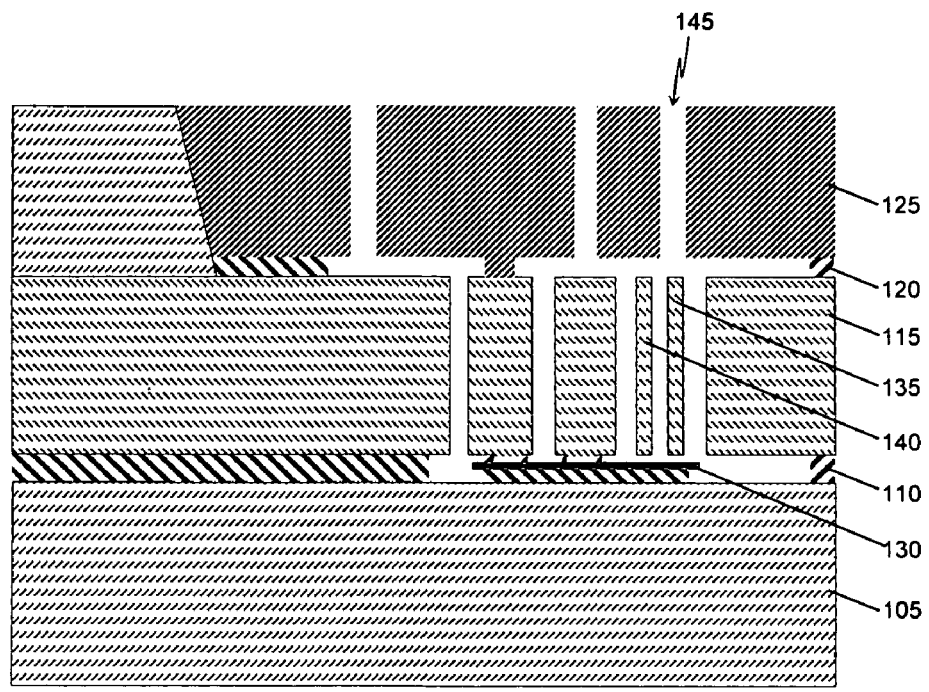
FIGS. 1A and 1B show schematically layers in encapsulated MEMS devices after a vapor-phase etch but before final sealing.
Figure 1B:
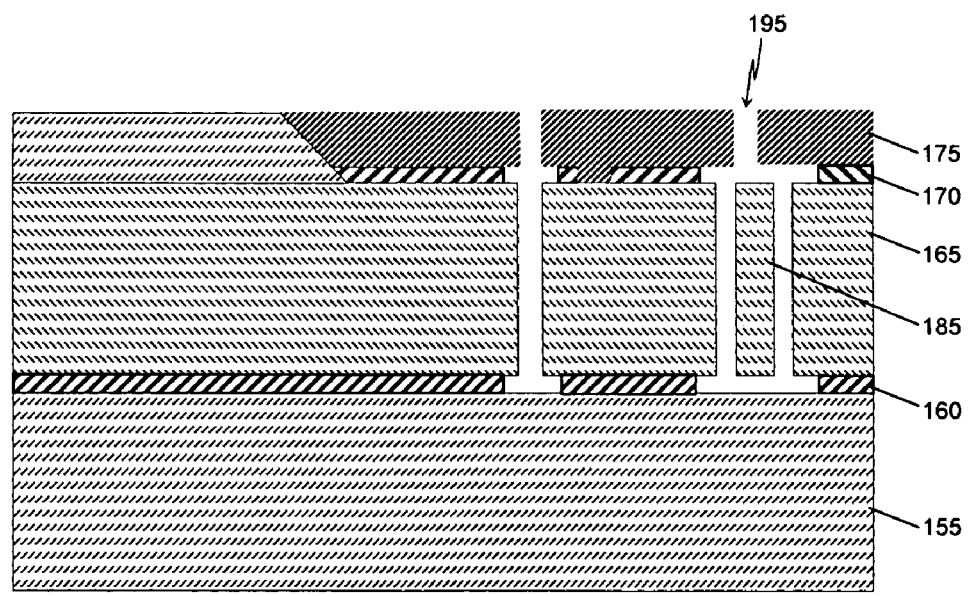

FIGS. 1A and 1B show schematically layers in encapsulated MEMS devices after a vapor-phase etch but before final sealing. Processes leading to the creation of structures such as those shown in FIGS. 1A and 1B are explained in Partridge ("Microelectromechanical systems, and methods for encapsulating and fabricating same," US Patent Application Publication US 2004/0248344 A1) and Candler ("Single Wafer Encapsulation of MEMS Devices," IEEE Transactions on Advanced Packaging, Vol. 26, No. 3, August 2003, pages 227-232) both of which are incorporated herein by reference. In FIGS. 1A and 1B formation of an active layer, patterning of a first seal layer and release have all been completed.

In FIG. 1A layer 105 is a substrate such as a silicon wafer. Clearly other substrate materials such as germanium or III-V materials may be desirable for certain applications. Layer 110 is a buried insulator (normally oxide) layer. Layer 115 is the device layer and normally consists of single- or poly-crystalline epitaxial silicon; however, other materials are possible just as for substrate 105. Substrate 105 and layers 110 and 115 may be conveniently provided in the form of a silicon-on-insulator (SOI) wafer. SOI wafers created by either buried oxide implants or wafer bonding techniques are widely available.

Layer 120 is a sacrificial spacer layer normally consisting of silicon dioxide. Layer 125 is an epitaxial film deposited as an initial encapsulation step. Layer 125, which is commonly an epitaxial silicon film, is patterned to provide vent trenches such as vent 145. Devices such as 135 and 140 in device layer 115 have been released typically by dry etching sacrificial layers 110 and 120. In a typical scenario layers 110 and 120 consist of silicon dioxide which may be etched with an HF vapor etch. Layer 130 is a buried polysilicon layer which serves as an electrical interconnect for MEMS devices.

In FIG. 1B layer 155 is a substrate such as a silicon wafer. Layer 160 is a buried insulator (normally oxide) layer. Layer 165 is the device layer and normally consists of single- or poly-crystalline epitaxial silicon; however, other materials are possible just as for substrate 155. Layers 155, 160 and 165 are often provided as an SOI wafer as mentioned above.

Layer 170 is a sacrificial spacer layer normally consisting of silicon dioxide. Layer 175 is an epitaxial film deposited as an initial encapsulation step. Film 175, which is commonly an epitaxial silicon film, is patterned to provide vent trenches such as vent 195. Devices such as 185 in device layer 165 have been released by dry etching sacrificial layers 160 and 170. In a typical scenario layers 160 and 170 consist of silicon dioxide which may be etched with an HF vapor etch.

Figure 2A:
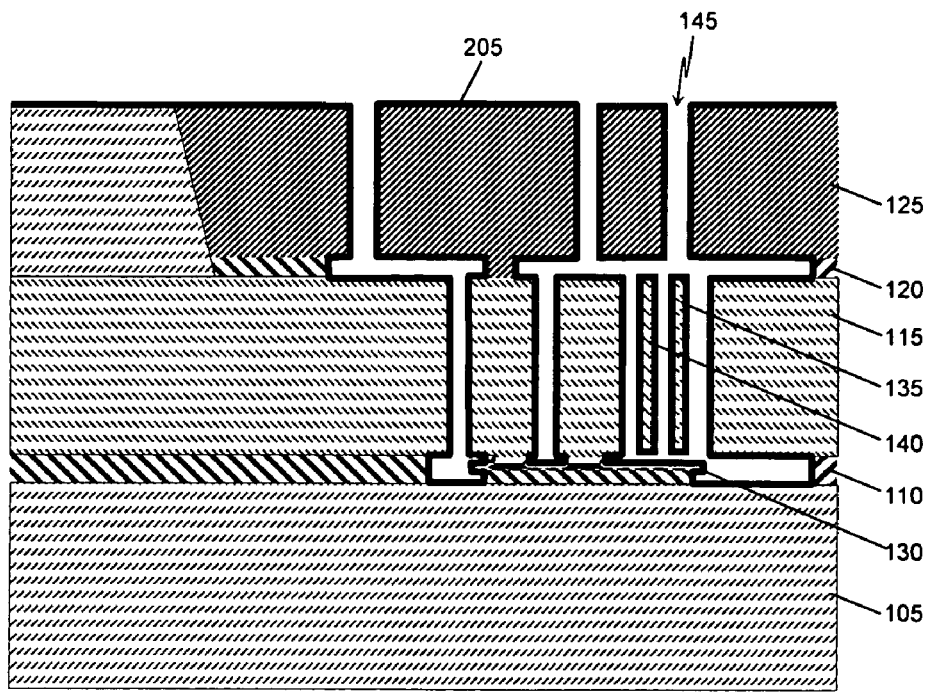
FIGS. 2A and 2B show schematically layers in the encapsulated MEMS devices of FIGS. 1A and 1B after deposition of a thin, high-temperature anti-stiction coating.
Figure 2B:
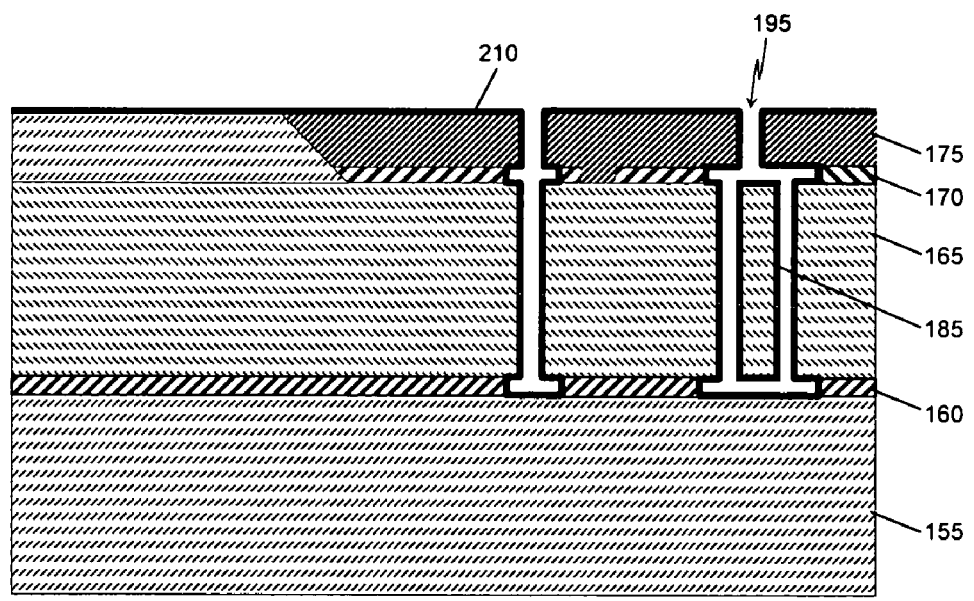

FIGS. 2A and 2B show schematically layers in the encapsulated MEMS devices of FIGS. 1A and 1B after deposition of a thin anti-stiction coating. In FIGS. 2A and 2B heavy line 205 and 210 represents an anti-stiction film coating that is stable at high temperatures. Typically the film is between about 1 nm and 200 nm thick. It may even be thicker if no other characteristics of the device are compromised. A preferred anti-stiction film is silicon carbide (SiC) deposited in a low-pressure chemical vapor deposition (LPCVD) process or plasma enhanced chemical vapor deposition (PECVD) process but sputter-deposited ceramic films such as aluminum nitride are also acceptable. These films are stable under subsequent processing steps at temperatures above 450 C and even as hot as 1100 C and above. For purposes of this application, any anti-stiction coating that maintains its anti-stiction properties even after being heated to temperatures greater than 450 C is a "high-temperature" anti-stiction coating.

SiC films may be deposited by LPCVD at around 800 C using precursor 1,3-disilabutane in a hot-wall reactor. See, for example, "Silicon Carbide for Enhanced MEMS Reliability," D. Gao, et al., Proceedings of the 2004 Sensors and Actuators Workshop, Hilton Head, S.C., 2004, incorporated herein by reference. A feature of the anti-stiction film is that it is an electrical insulator. A conductive film would create short circuits which could render the MEMS inoperable.

Figure 3A:
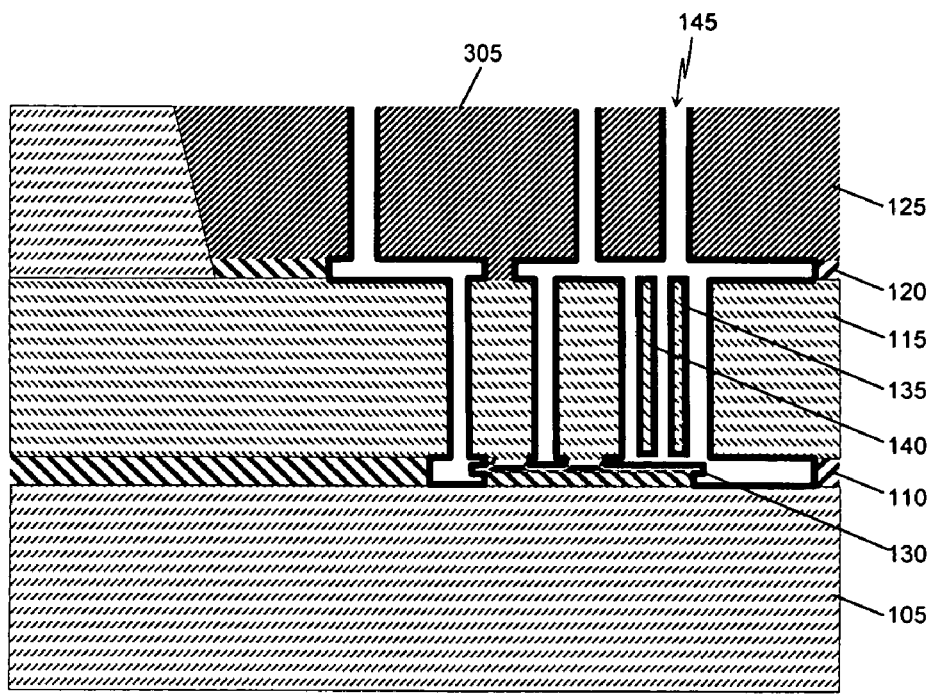
FIGS. 3A and 3B show schematically layers in the encapsulated MEMS devices of FIGS. 2A and 2B after an anisotropic etch.
Figure 3B:
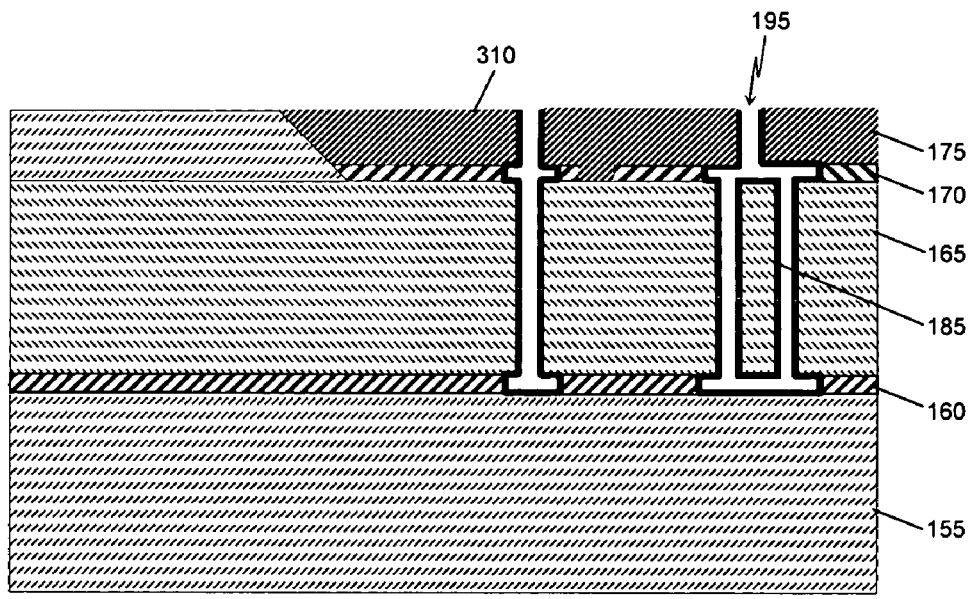

FIGS. 3A and 3B show schematically layers in the encapsulated MEMS devices of FIGS. 2A and 2B after an anisotropic etch. The purpose of the etch is to remove the anti-stiction film 205 or 210 to expose at least part of surface 305 or 310 to facilitate further processing and allow for electrical contacts to the underlying structures. The etch can be a reactive process such as hydrogen bromide reactive ion etching or a physical process such as ion milling in an argon plasma. There are several other options for the etch chemistry such as HCl, $CF_4+O_2$, $SF_6+O_2$, $NF_3$ $(+O_2)$, or $C_2F_6$. An anisotropic etch removes the portion of film 205 or 210 exposed on the top of the wafer while leaving the anti-stiction coating intact on internal surface such as the surface of devices 135, 140 and 185.

Figure 4A:
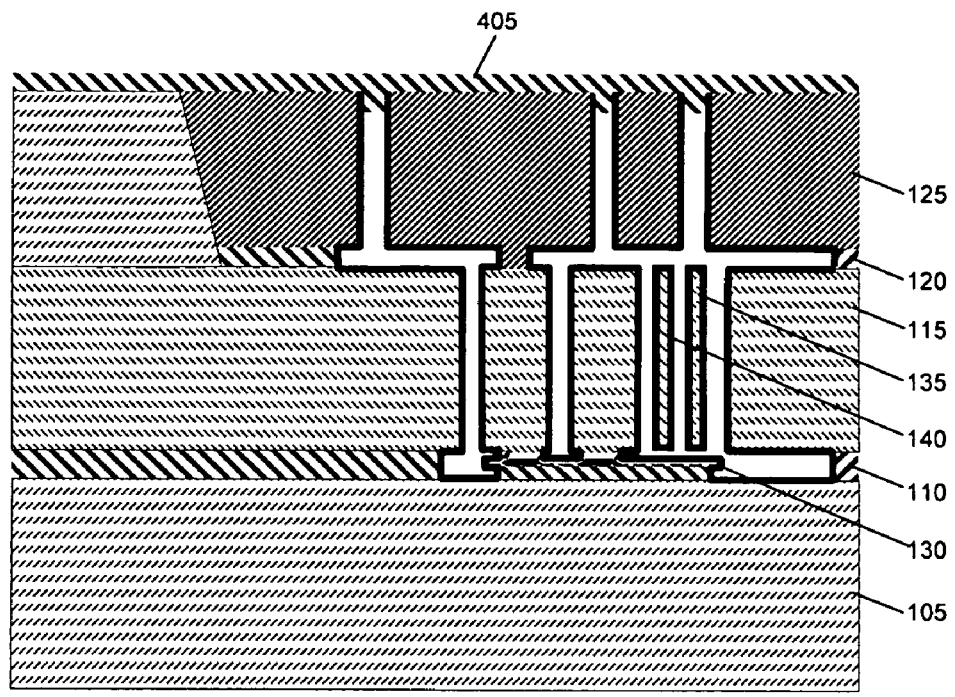
FIGS. 4A and 4B show schematically layers in the encapsulated MEMS devices of FIGS. 3A and 3B after sealing.
Figure 4B:
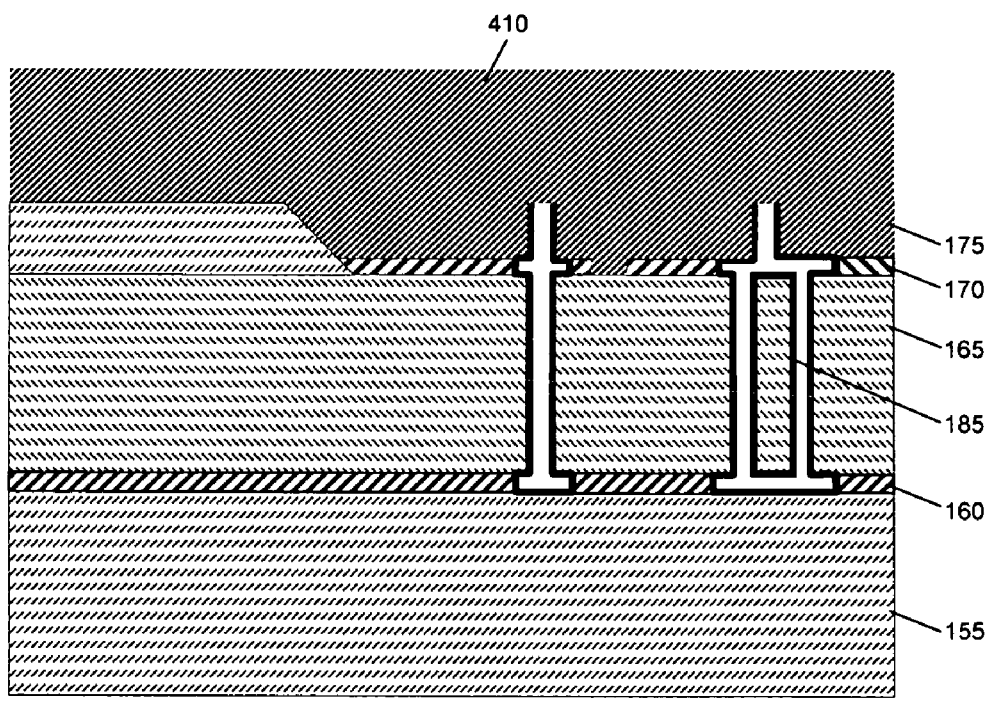
Figure 5A:
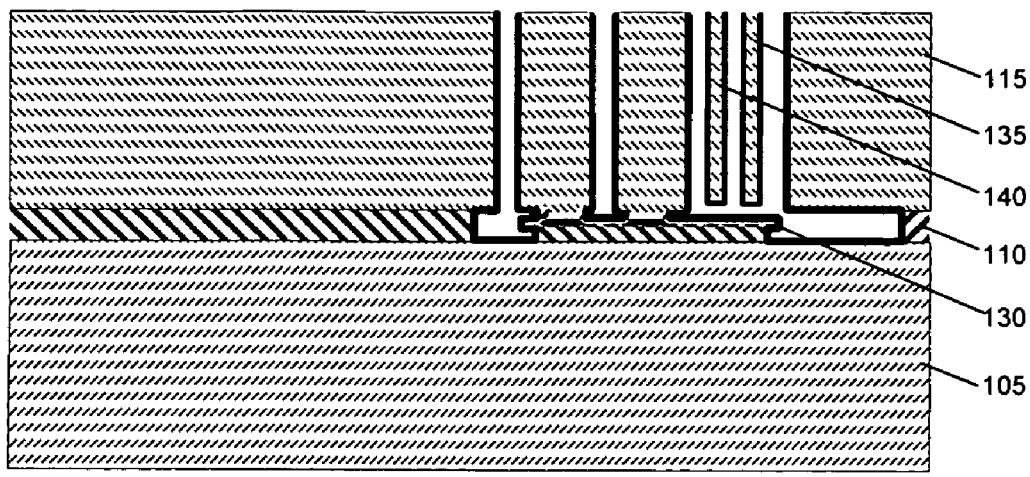
FIGS. 5A and 5B show schematically layers in MEMS devices with an anti-stiction coating applied after initial active layer fabrication.
Figure 5B:
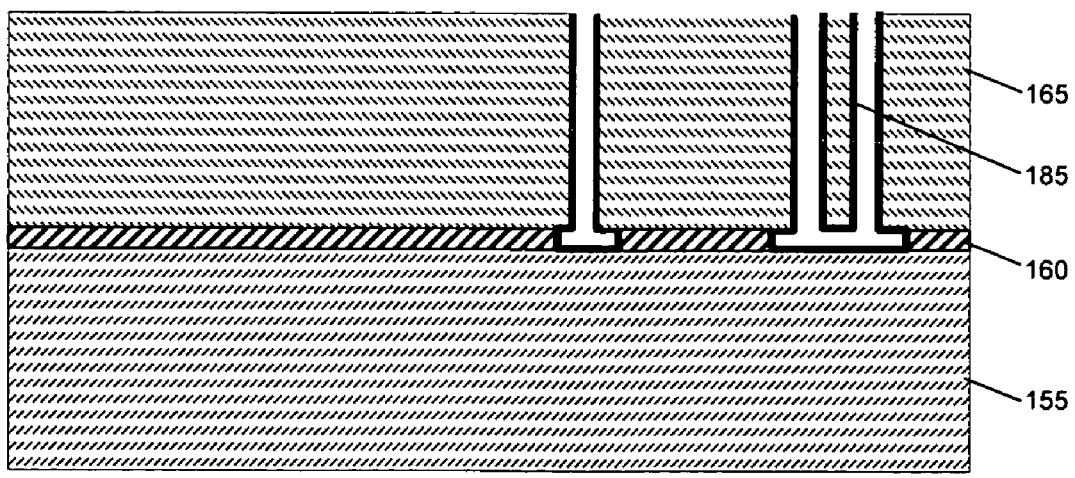

FIGS. 4A and 4B show schematically layers in the encapsulated MEMS devices of FIGS. 3A and 3B after sealing. Sealing is the process of closing up vents such as vents 145 and 195 in FIGS. 3A and 3B. In FIG. 4A layer 405 is a deposited low-temperature oxide layer while in FIG. 4B layer 410 is an epitaxially grown silicon layer. When an epitaxial silicon layer is used as a seal as illustrated in FIG. 4B, a film of silicon will be deposited over the anti-stiction coating on internal parts of the MEMS. The coating may retain its anti-stiction properties, however. Maintaining the anti-stiction properties after redeposition of Si may be enhanced by depositing carbon-rich SiC films as anti-stiction coatings. Supported by the high temperatures during the epitaxial sealing process, diffusion will lead to the forming of carbide between the excess carbon in the anti-stiction coating and the extra deposited Si. Hence, even if extra Si has been deposited, it will form SiC again after the high temperature treatment and thus again support the anti-stiction properties. Anti-stiction coatings increase the stiffness of the surface to which they are applied thereby decreasing the local compliance. A thin silicon overcoat should preserve this behavior. On the other hand low temperature oxide sealing avoids these complications and is therefore preferred if silicon overcoating presents a problem. Further, SiC itself may be used as the layer sealing the vents to avoid overcoating problems.

It is also possible to deposit and pattern an anti-stiction film after fabrication of the active device layer but before deposition of an encapsulation layer. FIGS. 5A and 5B show schematically layers in MEMS devices with an anti-stiction coating applied at this point. FIGS. 5A and 5B represent the structures depicted in FIGS. 1A and 1B but at an earlier stage of processing.

In FIG. 5A layer 105 is a substrate such as a silicon wafer. Clearly other substrate materials such as germanium or III-V materials may be desirable for certain applications. Layer 110 is a buried insulator (normally oxide) layer. Layer 115 is the device layer and normally consists of single- or poly-crystalline epitaxial silicon; however, other materials are possible just as for substrate 105. Substrate 105 and layers 110 and 115 may be conveniently provided in the form of a silicon-on-insulator (SOI) wafer. SOI wafers created by either buried oxide implants or wafer bonding techniques are widely available. Layer 130 is a buried polysilicon layer which serves as an electrical interconnect for MEMS devices. Items 135 and 140 are released MEMS devices.

In FIG. 5B layer 155 is a substrate such as a silicon wafer. Layer 160 is a buried insulator (normally oxide) layer. Layer 165 is the device layer and normally consists of single- or poly-crystalline epitaxial silicon; however, other materials are possible just as for substrate 155. Layers 155, 160 and 165 are often provided as an SOI wafer as mentioned above. Item 185 is a released MEMS device.

In the scenario shown in FIGS. 5A and 5B the anti-stiction film is applied to the device layer directly. An anisotropic etch then removes the film from exposed surfaces but does not attack the sides of MEMS devices (e.g. devices 135, 140, 185). The vertical sidewalls of a device are most likely to experience stiction in the absence of an anti-stiction coating. Device processing proceeds conventionally after this point as described in Partridge or Candler.

For example, a sacrificial layer would then be deposited and followed by a conventional multi-step sealing process. This approach requires good control over the anisotropy of the anti-stiction-film etch. The subsequent redeposition and etching of a sacrificial film may affect the anti-stiction properties of the anti-stiction film.

As one skilled in the art will readily appreciate from the disclosure of the embodiments herein, processes, machines, manufacture, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, means, methods, or steps.

While the systems and methods described herein have been described in connection with what are presently considered to be the most practical and preferred embodiments, it is to be understood that the systems and methods are not limited to the disclosed embodiments and alternatives as set forth above, but on the contrary is intended to cover various modifications and equivalent arrangements included within the scope of the following claims.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The above description of illustrated embodiments of the systems and methods is not intended to be exhaustive or to limit the systems and methods to the precise form disclosed. While specific embodiments of, and examples for, the systems and methods are described herein for illustrative purposes, various equivalent modifications are possible within the scope of the systems and methods, as those skilled in the relevant art will recognize. The teachings of the systems and methods provided herein can be applied to other systems and methods, not only for the systems and methods described above.

The elements and acts of the various embodiments described above can be combined to provide further embodiments. These and other changes can be made to the systems and methods in light of the above detailed description.

Each publication, patent, and/or patent application mentioned in this specification is herein incorporated by reference in its entirety to the same extent as if each individual publication and/or patent application was specifically and individually indicated to be incorporated by reference.

In general, in the following claims, the terms used should not be construed to limit the systems and methods to the specific embodiments disclosed in the specification and the claims, but should be construed to include all systems that operate under the claims. Accordingly, the systems and methods are not limited by the disclosure, but instead the scope of the systems and methods are to be determined entirely by the claims.

What is claimed is:

1. A process for making a MEMS device comprising:
   providing on a substrate an encapsulated MEMS structure comprising a released device layer and a vented cap layer;
   depositing a high-temperature anti-stiction coating on the MEMS structure, wherein the anti-stiction coating is a film of carbon-rich silicon carbide;
   removing at least part of an exposed top layer of the anti-stiction coating; and,
   sealing the structure.

2. The process of claim 1 wherein the anti-stiction coating is a film of carbon-rich silicon carbide between about one nanometer and two hundred nanometers thick.

3. A process for making a MEMS device comprising:
   providing on a substrate an encapsulated MEMS structure comprising a released device layer and a vented cap layer;
   depositing a high-temperature anti-stiction coating on the MEMS structure, wherein the anti-stiction coating is a film of aluminum nitride;
   removing at least part of an exposed top layer of the anti-stiction coating; and,
   sealing the structure.

4. The process of claim 1 wherein the removing the exposed top layer is accomplished by a hydrogen bromide reactive ion etch.

5. The process of claim 1 wherein the removing the exposed top layer is accomplished by ion milling in an argon plasma.

6. The process of claim 1 wherein the device layer and substrate are fabricated from a silicon-on-insulator wafer.

7. The process of claim 1 wherein sealing the structure is accomplished by deposition of low temperature oxide.

8. The process of claim 1 wherein sealing the structure is accomplished by epitaxial growth of silicon.

9. A process for making a MEMS device comprising:
   providing on a substrate a MEMS structure comprising a released device layer;
   depositing a high-temperature anti-stiction coating on the MEMS structure, wherein the anti-stiction coating is a film of carbon-rich silicon carbide;
   removing part of an exposed top layer of the anti-stiction coating; and,
   encapsulating the structure.

10. The process of claim 9 wherein the anti-stiction coating is a film of carbon-rich silicon carbide between about one nanometer and two hundred nanometers thick.

11. A process for making a MEMS device comprising:
    providing on a substrate a MEMS structure comprising a released device layer;
    depositing a high-temperature anti-stiction coating on the MEMS structure, wherein the anti-stiction coating is a film of aluminum nitride;
    removing part of an exposed top layer of the anti-stiction coating; and,
    encapsulating the structure.

12. The process of claim 9 wherein the removing the exposed top layer is accomplished by a hydrogen bromide reactive ion etch.

13. The process of claim 9 wherein the removing the exposed top layer is accomplished by ion milling in an argon plasma.

14. The process of claim 9 wherein the device layer and substrate are fabricated from a silicon-on-insulator wafer.

15. The process of claim 9 wherein encapsulating the structure is accomplished by epitaxial growth of silicon.

16. A process for making a MEMS device comprising:
    providing on a substrate a MEMS structure comprising a released device layer;
    depositing a high-temperature anti-stiction coating that includes a thickness of about 1 nm to about 200 nm on the MEMS structure, wherein the anti-stiction coating is a film of carbon-rich silicon carbide;
    removing part of an exposed top layer of the anti-stiction coating; and,
    encapsulating the structure.

17. The process of claim 16 wherein the anti-stiction coating is a film of carbon-rich silicon carbide.

18. A process for making a MEMS device comprising:
providing on a substrate a MEMS structure comprising a released device layer;
depositing a high-temperature anti-stiction coating that includes a thickness of about 1 nm to about 200 nm on the MEMS structure, wherein the anti-stiction coating is a film of aluminum nitride;
removing part of an exposed top layer of the anti-stiction coating; and,
encapsulating the structure.

19. A process for making a MEMS device comprising:
providing on a substrate a MEMS structure comprising a released device layer;
depositing a high-temperature anti-stiction coating on the MEMS structure, wherein the anti-stiction coating is one of a film of carbon-rich silicon carbide and aluminum nitride;
removing part of an exposed top layer of the anti-stiction coating; and,
encapsulating the structure.

20. The process of claim 19 wherein the anti-stiction coating is between about one nanometer and two hundred nanometers thick.

21. The process of claim 19 wherein encapsulating the structure is accomplished by epitaxial growth of silicon.

* * * * *